United States Patent [19]

Takashima

[11] Patent Number: 5,704,286
[45] Date of Patent: Jan. 6, 1998

[54] SCREEN PRINTING APPARATUS

[75] Inventor: Yukio Takashima, Hadano, Japan

[73] Assignee: Kabushik Kaisha Toshiba, Kanagawa-ken, Japan

[21] Appl. No.: 691,788

[22] Filed: Aug. 2, 1996

[51] Int. Cl.⁶ .................................. B05C 17/06
[52] U.S. Cl. .............................. 101/127; 101/123
[58] Field of Search .................... 101/127, 129, 101/127.1, 123

[56] References Cited

U.S. PATENT DOCUMENTS

| | | | |
|---|---|---|---|
| 3,930,445 | 1/1976 | Jaffa | 101/120 |
| 4,638,733 | 1/1987 | Schneider et al. | 101/114 |
| 4,872,261 | 10/1989 | Sanyal et al. | 29/840 |
| 5,406,699 | 4/1995 | Oyama | 29/827 |
| 5,452,655 | 9/1995 | Tani | 101/123 |

FOREIGN PATENT DOCUMENTS

| | | | |
|---|---|---|---|
| 2039726 | 3/1972 | Germany | 101/127 |
| 60-262688 | 12/1985 | Japan | 101/127 |
| 62-160290 | 1/1986 | Japan | 101/127 |

*Primary Examiner*—Edgar S. Burr
*Assistant Examiner*—Dave A. Ghatt
*Attorney, Agent, or Firm*—Finnegan, Henerson, Farabow, Garrett & Dunner, L.L.P.

[57] ABSTRACT

A screen printing apparatus for printing a printing material to the front surface of a work that has a protrusion portion, comprising a stage for mounting the work, a screen frame formed on the upper surface of the stage, a screen mask secured to the screen frame, the screen mask having an opening portion at a particular printing position and a protrusion portion that covers the protrusion portion of the work, and a squeegee member moving in a particular direction for squeezing the printing material on the screen mask to the opening portion of the screen mask. In addition, the side surfaces of the protrusion portion of the screen mask are inclined to the main front surface for 90 degree or less. The portion that contacts the protrusion portion and the portion that does not contact the protrusion portion are separated by a slit.

12 Claims, 4 Drawing Sheets

MOVING DIRECTION OF SQUEEGEE

MOVING DIRECTION OF SQUEEGEE

MOVING DIRECTION OF SQUEEGEE

SCREEN PRINTING APPARATUS

BACKGROUND OF THE INVENTION

1. Field of the Invention

The present invention relates to a structure of a screen printing apparatus, in particular, structures of a screen mask and a printing squeegee.

2. Description of the Related Art

As a mounting step of an electronic circuit unit, there is a solder printing step for printing a solder on a wiring board on which electronic parts such as IC chips have been mounted. At this step, a technology for speedily and accurately printing a fine pattern corresponding to a fine electronic circuit unit without damaging the electronic parts that protrude from the wiring board is desired.

As a method for printing a pattern to a flat surface of a substance that has a protrusion portion, the half etching method is known. (In this specification, hereinafter a substance to which a printing material is printed, for example, printed-circuit board, is referred to as a work.) FIG. 3A is a sectional view showing an outlined structure of a screen printing apparatus according to the half etching method.

In the half etching method, a squeegee member 30 is moved so that the flat front surface of a screen is pressed. A paste type printing material 32 (such as a solder, a resin, or the like) on a screen mask 31 is squeezed to an opening portion 31a formed on the screen mask 31 so as to screen print the printing material 32 to the front surface of the work 34 on a stage 33.

In this example, a recess portion 31b is formed on the screen mask 31 corresponding to the protrusion portion on the work 34. Thus, the protrusion portion on the work 34 is protected by the recess portion. In addition, since the front surface of the screen mask 31 is flat and thereby does not have a protrusion portion, the printing material 32 is equally pressed by the squeegee member 30 and thereby precisely printed.

However, due to such a shape of the screen mask 31, it has the following problem. FIG. 3B is an enlarged sectional view showing the screen mask 31 shown in FIG. 3A.

To maintain the durability of the screen mask 31 for the screen printing operation, the screen mask 31 is composed of a material such as SUS (stainless steel) that has a high durability. However, the plate thickness h' of the recess portion 31b is smaller than the plate thickness h of the screen mask 31. Thus, in the case that the surface area of the recess portion 31b is large, when the screen printing operation is repeatedly performed, the screen mask is adversely deformed. Consequently, the screen mask cannot be used for the screen printing operation. In other words, the screen mask has a problem of the durability.

Moreover, in consideration of the durability, generally, the thickness h' of the screen mask on which the recess portion 31b is formed should satisfy the relation h'≧0.5 h. In addition, to accurately print a fine pattern, the plate thickness h should be 300 μm or less. Thus, such a method cannot be used for a work 34 that has a protrusion portion with a thickness of 150 μm or more.

As a method for solving such a problem, a bidirectional printing method is known. FIG. 4A is a perspective view showing an outlined structure of a screen printing apparatus according to the bidirectional printing method.

In this method, a first squeegee member 40 and a second squeegee member 40 are disposed. The first squeegee member 40 has a recess portion 40c that does not contact a protrusion portion 41c of a screen mask 41. The first squeegee member 40 is moved in the direction x on the screen mask 41 that has opening portions 41a and the protrusion portion 41c that covers a protrusion portion on the work. The second squeegee member 40 is moved in the y direction of the screen mask 41. Thus, a screen printing operation is performed. In this method, the first and second squeegee members are moved only on the flat surface of the screen mask, not the protrusion portion on the work.

Thus, in this method, as shown in FIG. 4B, since the protrusion portion 41c of the screen mask has the same plate thickness as the other portions, even if the screen printing operation is repeatedly performed, the durability of the screen mask does not deteriorate. However, when many opening portions 41a are formed on the screen mask, since the two squeegee members 40 are moved in the two directions, dual printing portions 45 where a printing material is dually printed inevitably take place.

The dual printing portions cause the thickness of the printing material to deviate and the amount of stain (amount of printing material that protrudes from a desired shape) to increase.

In particular, when a particular pattern is printed and connected to leads of electronic parts with a solder, the stain of excessive solder causes an electric short.

Thus, a solution of the problem of the dual printing portions has been strongly desired.

As an example of such a solution, a method for changing the printing pressures of the two squeegee members 40 against the screen mask 41 was proposed. In this method, although the printing defect may be suppressed to some extent, the printing pressures cannot be changed for each screen mask 41 on which large and small opening portion are formed. Thus, with this method, the problem of the dual printing portions cannot be thoroughly solved.

As described above, in the half etching method, when a paste type printing material is printed on a work with a protrusion portion, the recess portion of the screen mask causes the durability of the screen mask to deteriorate as the printing operation is repeated. In addition, the height of the work is restricted.

On the other hand, in the bidirectional printing method, when the screen mask has many opening portions to be printed and two squeegee members are moved, the amount of the printing material deviates or the printing material stains at opening portions that are subject to be pressed with the two squeegee members.

SUMMARY OF THE INVENTION

An object of the present invention is to provide a screen printing apparatus that can solve the above-described problems, that can precisely and speedily screen print a printing material on the front surface of a work without damaging a protrusion portion thereon, and that has a satisfactory durability for a repeated printing operation.

A first aspect of the present invention is a screen printing apparatus for printing a printing material to the front surface of a work that has a protrusion portion, comprising a stage for mounting the work, a screen frame formed on the upper surface of the stage, a screen mask secured to the screen frame, the screen mask having an opening portion at a particular printing position and a protrusion portion that covers the protrusion portion of the work, and a squeegee member moving in a particular direction for squeezing the printing material on the screen mask to the opening portion of the screen mask.

A second aspect of the present invention is the screen printing apparatus of the first aspect, wherein the protrusion portion of the work is an electronic part.

A third aspect of the present invention is the screen printing apparatus of the first aspect, wherein the squeegee member has a slit at the boundary between a portion that contacts the protrusion portion of the screen mask and a portion that does not contact the protrusion portion of the screen mask.

A fourth aspect of the present invention is the screen printing apparatus of the third aspect, wherein the hardness of the portion of the squeegee member that contacts the protrusion portion of the screen mask is lower than the hardness of the portion that does not contact the protrusion portion of the screen mask.

A fifth aspect of the present invention is the screen printing apparatus of the third or fourth aspect, wherein the length of the portion of the squeegee member that contacts the protrusion portion of the screen mask is shorter than the length of the portion that does not contact the protrusion portion of the screen mask.

A sixth aspect of the present invention is the screen printing apparatus of the first aspect, wherein the side surfaces of the protrusion portion of the screen mask are inclined.

A seventh aspect of the present invention is the screen printing apparatus of the first aspect, wherein the printing material is solder.

The screen printing apparatus according to the present invention is suitable for printing a printing material to for example a circuit board on which electronic parts such as IC chips have been mounted (namely, to a component side that has protruded parts).

As the screen mask of the screen printing apparatus according to the present invention, a material with a high strength that withstands a heavily repeated printing operation is used. A stainless steel plate composed of SUS with a plate thickness of around 300 μm is used from a durability point of view. The screen mask of the screen printing apparatus according to the present invention has a substantially flat surface except for a protrusion portions. In addition, the screen mask has opening portions to which a printing material is printed. The protrusion portion of the screen mask covers a protrusion portions of the work so as to prevent the protrusion portion of the work from being damaged by the squeegee member in the printing operation. According to the present invention, the plate thickness of the protrusion portion of the screen mask is the same as the plate thickness of the other portions. Thus, the strength of the protrusion portion is substantially the same as the strength of the other portions so that the screen mask withstands the repeated printing operation. Although the height of the protrusion portion varies depending on an electronic part that has been mounted on the work, the height is around 1.5 mm.

As the printing material, a conductive resin, a solder, or the like is used.

The squeegee member that contacts the screen mask, carries a required printing material, and squeezes the printing material to predetermined opening portions is of a plate type having a flat sectional area, a sward type having a sharp sectional area, or the like. According to the present invention, the shape of the squeegee member is not limited. As shown in FIG. 3A, an edge portion of the flat plate is used for such a purpose.

As the material of the squeegee member, a metal, a rubber or a plastic can be used. As an example of the metal, a stainless steel plate with a required hardness and a required elasticity can be used. As an example of the rubber material, a polyurethane rubber in a wide range of hardness can be used. A combination of a metal and a rubber plate can be used. A combination of rubber plates with different hardness can be used.

While the squeegee member presses and contacts the front surface of the screen mask, the squeegee member carries the printing material on the front surface of the screen mask so as to squeeze the opening portions thereon with the printing material. At this point, the opening portions should be satisfactorily fulled with the printing material. Thus, a proper pressure should be applied to the edge of the squeegee member. However, in the screen printing apparatus according to the present invention, since the protrusion portion of the screen mask has a thickness satisfactory for the repeated printing operation, a protrusion portion of a work such as an electronic part can be satisfactorily protected.

When a slit is formed at the boundary between a portion of the squeegee member that contacts a protrusion portion of the screen mask and the other portion, a printing material can be effectively printed.

In other words, when the squeegee member passes through the front surface of the screen mask, unless the squeegee member does not have a slit, a portion other than the protrusion portion is affected by the resistance applied to the squeegee member. Thus, the pressure of the squeegee member applied to the screen mask varies. Consequently, the opening portions on the surface other than the protrusion portion are not satisfactorily filled with the printing material.

However, with the slit formed on the squeegee member according to the present invention, the influence of the resistance can be completely prevented.

In the squeegee member having the slit according to the present invention, the material of the portion of the squeegee member that contacts the protrusion portion on the screen mask may be different from the material of the other portion so that the hardness of the former material is lower than the hardness of the latter material or the flexibility of the former material is higher than the flexibility of the latter material.

When a flat squeegee member composed of polyurethane rubber is used, a rubber with a hardness of 80 (JIS A) is used for the portion that contacts the protrusion portion and another type rubber with a hardness of 90 (JIS A) is used for the other portion. Thus, since the force applied to the entire squeegee member can be increased, the printing defect due to insufficient printing pressure can be prevented. In addition, the resistance to the portion of the squeegee member that contacts the protrusion portion can be reduced from being applied to the other portion.

Moreover, in the squeegee member having the slit according to the present invention, when the length of the portion of the squeegee member that contacts the protrusion portion of the screen mask is shorter than the length of the other portion, a similar effect can be obtained.

Thus, when the length of the portion of the squeeze portion that contacts the protrusion portion of the screen mask is shorter than the length of the other portion, since the length and position of the portion of the squeegee member that contacts the protrusion portion of the screen mask becomes the same as the length and position of the other portion, the printing material is prevented from being unevenly printed. Thus, since the vertical resistance applied to the squeegee member is ignored, a constant pressure can be applied to the work.

As described above, in the screen printing apparatus that screen prints the printing material to a work that has a protrusion portion, the screen mask has a protrusion portion that protects the protrusion portion of the work, an electronic part such as an IC chip that has been mounted on the work such as a circuit board is not damaged. In addition, when the screen has a slit, the printing material can be equally printed.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to the accompanying drawings, a screen printing apparatus according to the present invention will be described.

First Embodiment

Figure 1A:
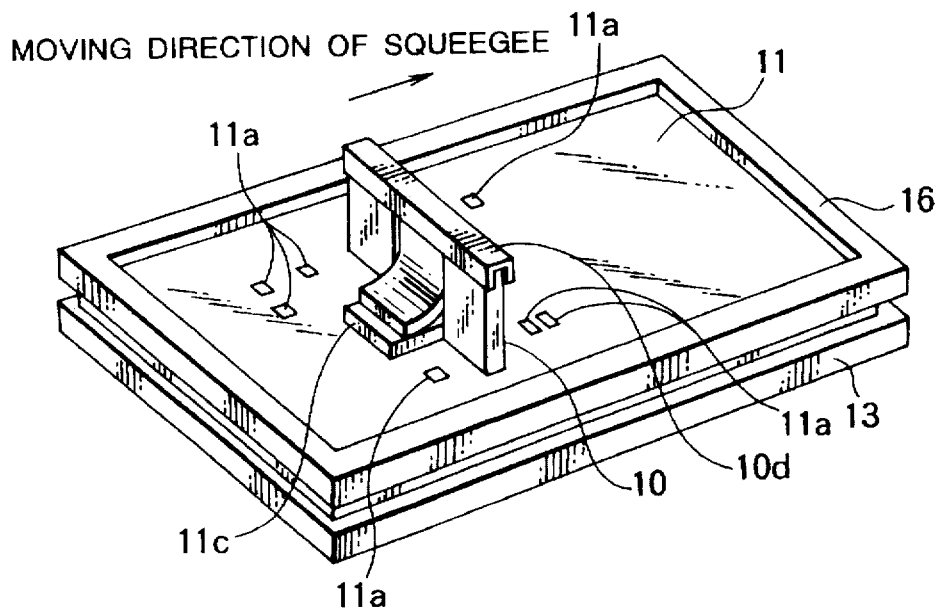
FIG. 1A is a perspective view showing an outlined structure of a screen printing apparatus according to a first embodiment of the present invention.
Figure 1B:
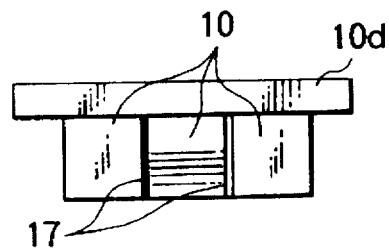
FIG. 1B is a front view showing a squeegee member shown in FIG. 1A.
Figure 1C:
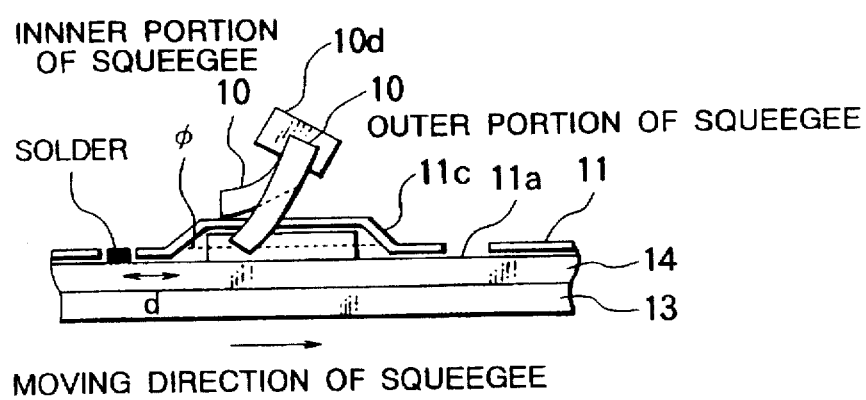
FIG. 1C is a sectional view showing the screen printing apparatus shown in FIG. 1A.

FIG. 1A is a perspective view showing an outlined structure of a screen printing apparatus according to a first embodiment of the present invention. FIG. 1B is a front view showing a squeegee member shown in FIG. 1A. FIG. 1C is a sectional view showing the screen printing apparatus shown in FIG. 1A.

The screen printing apparatus comprises a stage 13, a screen mask 11, a squeegee member 10, and a squeegee member holder 10d. The stage 13 mounts a work 14 that has a protrusion portion 15, in reality, a wiring board that mounts for example an IC chip. The screen mask 11 is disposed at a screen frame 16 on the upper surface of the work 14. The screen mask 11 has opening portions 11a and a protrusion portion 11c that covers the protrusion portion 15 of the work 14. The squeegee member 10 moves in a particular direction and squeezes solder on the screen mask 11 to the opening portions 11a of the screen mask 11. The squeegee member holder 10d holds the squeegee member 10. In addition, the squeegee member holder 10d is connected to a squeegee member operating unit (not shown). The squeegee member operating unit has a pressure applying mechanism that presses an edge of the squeegee member to the front surface of the screen mask with a constant pressure.

In this embodiment, the squeegee member 10 has slits that separate a portion that contacts the protrusion portion 11c of the screen mask 11 and the other portions. In this embodiment, the protrusion portion 11c of the screen mask 11 is formed at the center of the screen mask 11, as shown in FIG. 1B, two slits 17 are formed at the center portion of the squeegee member. Thus, the center portion of the squeegee member moves independently from the side portions formed on the left and right thereof.

In this case wherein the side portions are formed on the left and right side of the center portion of said squeegee member, it is desirable the side portions are designed symmetrically. Moreover, it is desirable the materials of the side portions are the same.

The screen mask 11 has a substantially flat surface except for the protrusion portion 11c. As shown in FIG. 1C, the front surface of the protrusion portion 11c of the screen mask 11 is flat. The outer shape of the protrusion portion 11c is formed in such a manner that a quadrangular pyramid is cut by a plane in parallel with the bottom surface. The side surfaces of the protrusion portion 11c of the screen mask 11 have an angle $\Phi$ to the moving direction of the squeegee member 10 as shown in FIG. 1C.

Figure 4A:
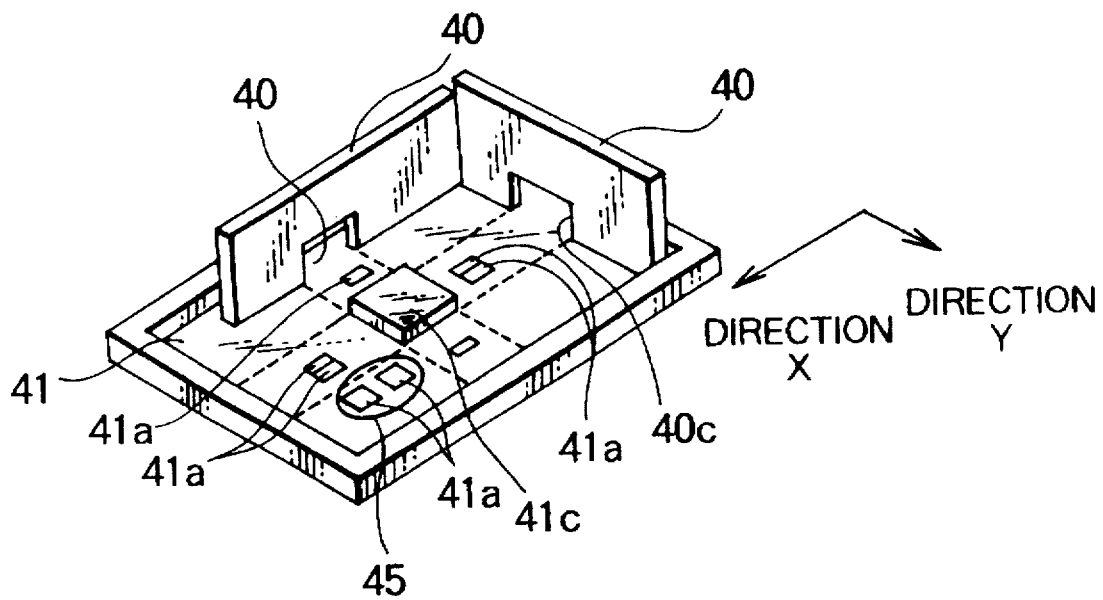
FIG. 4A is a perspective view showing an outlined structure of a screen printing apparatus according to the bidirectional printing method.
Figure 4B:
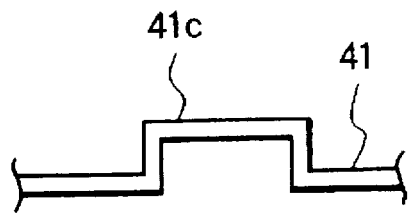
FIG. 4B is a sectional view showing a screen mask shown in FIG. 4A.

In the conventional structure, the angle $\Phi$ of the side surface of the protrusion portion 41C to the moving direction of the squeegee member is 90 degrees as shown in FIG. 4B. On the other hand, when the squeegee member passes through the protrusion portion 11c ($\Phi<90$ degrees) of the screen mask 11, the resistance of the protrusion portion 11C is gradually applied to the squeegee member 10. In addition, the squeegee member 10 of the present invention has the slits 17, the resistance decreases. Thus, when the squeegee member 10 passes through the protrusion portion 11c, the printing pressure of the squeegee member 10 to the screen mask 11 does not sharply vary. In other words, the printing pressure is substantially constant.

Thus, when the squeegee member 10 is moved in one direction on the screen mask 11 on which a solder has been supplied, the solder can be properly printed on the work 14 that has the protrusion portion.

In addition, since the plate thickness of the protrusion portion 11c of the screen mask 11 is not thinner than the other portion, the screen mask 11 has an excellent durability. Thus, the screen mask can withstand for heavily repeated printing operation.

The distance d of a lower edge of the protrusion portion 11c of the screen mask 11 and an opening portion 11a closest thereto is dependent on the angle $\Phi$, wherein the distance d should be selected so that the printing operation for the opening portion 11a closest to the protrusion portion 11c of the screen mask 11 is not adversely affected. Thus, the angle $\Phi$ should be selected corresponding to the distance d.

The side surfaces of the protrusion portion 11c of the screen mask 11 are inclined in the direction in parallel with the squeegee member 10. With such a structure, when the work 14 is a wiring board on which an electronic part has been mounted, leads of the electronic part can be protected.

Figure 5:
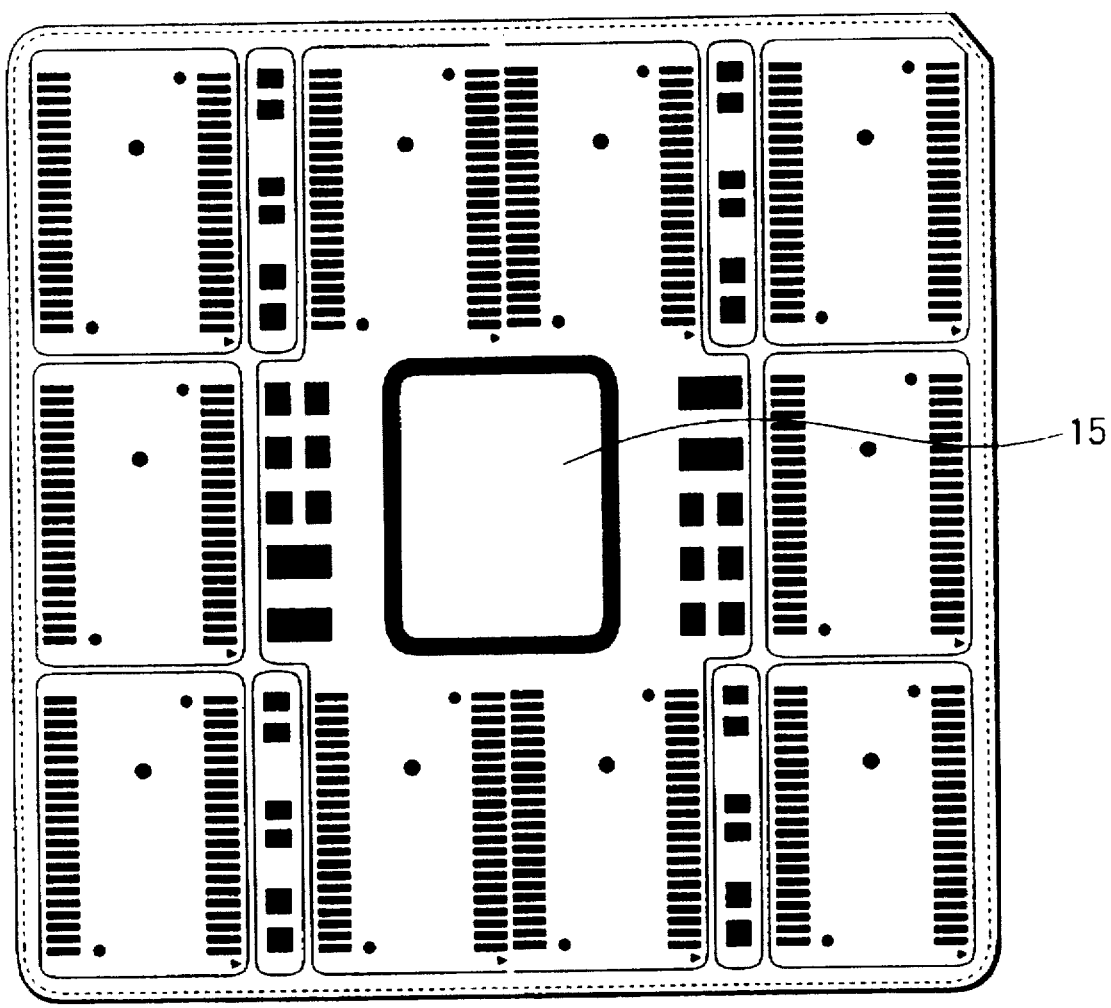
FIG. 5 is an example of a semiconductor device after the screen printing of the present invention.

FIG. 5 shows an example of a semiconductor device after screen printing using the squeegee of this embodiment, wherein 15 is the protrusion portion and another pattern is a printing pattern according to this embodiment.

Second Embodiment

Next, a screen printing apparatus according to a second embodiment of the present invention will be described.

Figure 2:
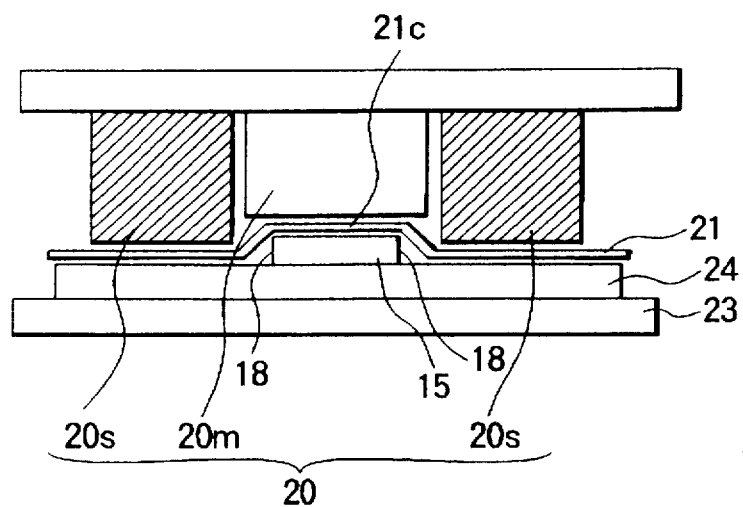
FIG. 2 is a front view showing an outlined structure of a screen printing apparatus according to a second embodiment of the present invention.
Figure 3A:
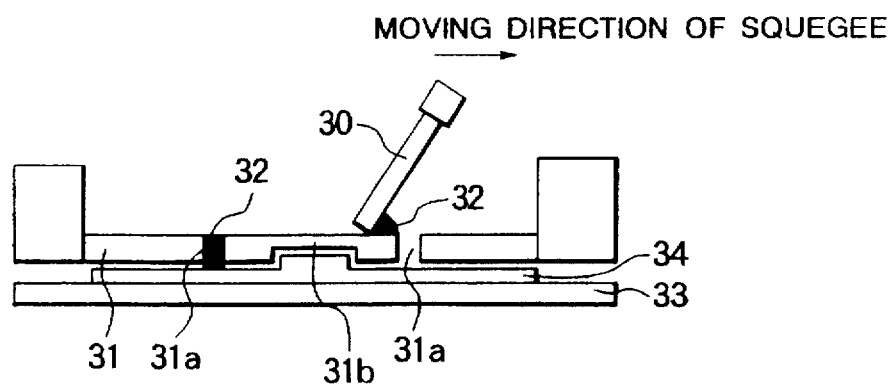
FIG. 3A is an sectional view showing an outlined structure of a screen printing apparatus according to the half etching method.
Figure 3B:
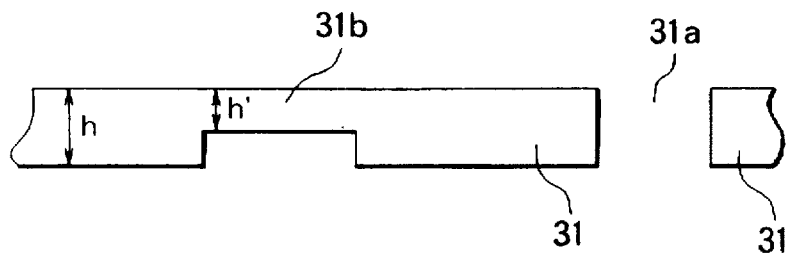
FIG. 3B is an enlarged sectional view showing a screen mask shown in FIG. 3A.

FIG. 2 is a front view showing an outlined structure of a screen printing apparatus according to a second embodiment of the present invention. The structure of the second embodiment is the same as the structure of the first embodiment except for the structure of a squeegee member. Thus, in this embodiment, the structure of only the squeegee member will be described.

In the first embodiment, the squeegee member 20 has a hardness of which the squeegee member 20 gets over the protrusion portion 21c of the screen mask 21 (in such a manner that the center portion of the squeegee member bends). Thus, in comparison with the structure of which the hardness of the squeegee member is high (namely, the flexibility of the squeegee member is low), the force of the squeegee member 20 to the solder and the printing pressure to the screen mask 21 are low.

In this situation, the solder cannot be fully squeezed in the opening portions of the screen mask 21. Moreover, after the printing operation is completed, when the work 24 is dismounted from the stage 23, the solder may be left on the screen mask due to an insufficient printing pressure. In particular, such a printing defect takes place when the size of the opening portions of the screen mask is large.

To prevent such a problem, in the second embodiment, the hardness of only a center portion 20m of a squeegee member 20 is low. In contrast, the hardness of side portions 20S of the squeegee member 20 is the same and higher than the hardness of the center portion 20m. Thus, with the structure of the squeegee member 20, since the force applied to the edge of the squeegee member 20 is increased, the above-mentioned printing defect does not take place. In addition, the resistance to the center portion 20m can be almost prevented from being applied to the other portions of the squeegee member 20. Moreover, since the squeegee member 20 is not bent by the force applied thereto (because the hardness of the left portion 20s is the same as the hardness of the right portion 20s), a constant printing pressure is applied to the screen mask 20.

When a polyurethane rubber, for example, is used as a squeegee material, the hardness of the polyurethane rubber is designed at about 80 (JIS A) for the center portion 20m of the squeegee member and at about 90 (JIS A) for the side portions 20s. Again in this embodiment 2, it is desirable the side portions 20s are designed symmetrically as to the hardness and dimension of the squeegee members.

Thus, as with the first embodiment, when the squeegee member 20 is moved once in one direction on the screen mask 21 on which the solder has been supplied, the solder can be properly printed on the front surface of the work 24 that has a protrusion portion. In addition, the protrusion portion 21c of the screen mask 21 has an enough plate thickness, the durability of the screen mask can be improved. Moreover, even if the screen mask 21 has large opening portions, the solder can be properly printed thereto.

Third Embodiment

Next, a screen printing apparatus according to a third embodiment of the present invention will be described. The structure of the third embodiment is the same as the structure of the first embodiment except for the structure of a squeegee member. Thus, in the third embodiment, the structure of only the squeegee member will be described.

In the third embodiment, the length of the surface of a portion that contacts the protrusion portion of the screen mask is shorter than the length of each of the other portions that do not contact the protrusion portion.

Moreover, in the third embodiment, the hardness of the portion that contacts the protrusion portion is the same as the hardness of each of the portions that do not contact the protrusion portion.

In particular, when the length of each of the portions of the squeegee member is varied, the same effects as the structure of the second embodiment can be obtained. As described above, in the structure of the second embodiment, the hardness of a portion that contacts the protrusion portion of the screen mask is lower than the hardness of each of the other portions that do not contact the protrusion portion so as the printing pressure of the portion that has the higher hardness is adjusted to get a good printing quality.

Again in this embodiment 3, it is desirable the side portions are designed symmetrically.

Thus, the solder can be equally printed to the front surface of the work.

The present invention is not limited to the above-described first, second, and third embodiments. In other words, these embodiments may be modified as follows.

When the protrusion portion of the work is formed on the left or right, not at the center, the number of slits formed in the squeegee member may be one. The material and hardness of each of the portions of the squeegee member may be changed corresponding to the material of the work, the size of the opening portions of the screen mask, and the printing material. The shape of the protrusion portion of the screen mask may be semi-spherical. In other words, the shape of the protrusion portion is not limited to the shape in the above-described embodiments as long as the influence of the resistance or the like to the squeegee member is reduced.

As explicated above, feature of the present invention is that the screen printing method enable to apply a screen printing successfully onto the works with protrusion portion, wherein good printing quality for the works with protrusion portion can be secured by designing the squeegee member as to have the slits which separate the center portion from the side portions and setting the hardness and the length of the both portions can balance the pressures on the entire portion of the works.

According to the present invention, with such a structure, the printing material can be printed on the front surface of the work speedily and accurately without damaging the protrusion portion of the work.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A screen printing apparatus for printing a printing material to a front surface of a wiring board from which an electronic part protrudes, comprising:

a stage for mounting the writing board;

a screen frame formed on an upper surface of said stage;

a screen mask secured to said screen frame, said screen mask having an opening portion at a particular printing position and a protrusion portion that covers the protruding electronic part; and a squeegee member moving in a particular direction for squeezing the printing material on said screen mask to the opening portion of said screen mask, wherein said squeegee member has slits at boundaries between a center portion that contacts the protrusion portion of said screen mask and side portions that do not contact the protrusion of said screen mask, the hardness of the center portion of said squeegee member is lower than the hardness of the side portions of said squeegee member.

2. The screen printing apparatus as set forth in claim 1, wherein the length in a perpendicular direction to the surface of said screen mask of the center portion of said squeegee member is shorter than the length of the side portions of said squeegee member.

3. The screen printing apparatus as set forth in claim 1 or 2, wherein said side portions of said squeegee member adjacent to said center portion are designed symmetrically.

4. The screen printing apparatus as set forth in claim 1 or 2,
wherein the hardness of said side portions of said squeegee member that do not contact the protrusion portion of said screen mask is the same.

5. The screen printing apparatus as set forth in claim 1, wherein side surfaces of the protrusion portion of said screen mask are inclined.

6. The screen printing apparatus as set forth in claim 1, wherein the printing material is a solder.

7. The screen printing apparatus as set forth in claim 1, wherein the printing material is a conductive resin paste.

8. The screen printing apparatus as set forth in claim 1, wherein the squeegee material is polyurethane rubber.

9. A screen printing apparatus for printing a printing material on a wiring board having a flat surface to be printed and having an electronic part protruding from the flat surface of the writing board, comprising:

a stage for mounting the wiring board;

a screen frame formed on an upper surface of the stage;

a screen mask secured to the screen frame, the screen mask being formed of a stainless steel plate and having an opening portion at a particular printing position and a protrusion portion that covers the protruding electronic part on the wiring board; and a squeegee member moving in a particular direction for squeezing the printing material on said screen mask to the opening portion of said screen mask, said squeegee member having slits at boundaries between a center portion that contacts the protrusion portion of said screen mask and side portions that do not contact the protrusion portion of said screen mask; and wherein the hardness of the center portion of said squeegee member is lower than the hardness of the side portions of said squeegee member.

10. The screen printing apparatus as set forth in claim 9, wherein a plate thickness of the protrusion portion is substantially the same as a thickness of the side portions of the screen mask.

11. The screen printing apparatus as set forth in claim 9, wherein the printing material is a solder.

12. The screen printing apparatus as set forth in claim 9, wherein side surfaces of a protrusion portion of said screen mask are inclined.

* * * * *

UNITED STATES PATENT AND TRADEMARK OFFICE
CERTIFICATE OF CORRECTION

PATENT NO. : 5,704,286
DATED : January 06, 1998
INVENTOR(S) : Yukio TAKASHIMA et al.

It is certified that error appears in the above-identified patent and that said Letters Patent is hereby corrected as shown below:

On Title Page, Item [73], in the Assignee, line 1, "Kabushik" should read --Kabushiki--.

On Title Page, under Attorney, Agent, or Firm, line 1 "Henerson" should read--Henderson--.

On Title Page, Item [57], in the Abstract, line 12, "90 degree" should read --90 degrees--.

Claim 8, Column 9, line 27, "material" should read --member--; and after "is", insert --formed of a--.

Signed and Sealed this

Twenty-fifth Day of August, 1998

Attest:

BRUCE LEHMAN

Attesting Officer

Commissioner of Patents and Trademarks